United States Patent
Minikey, Jr. et al.

(10) Patent No.: US 10,250,784 B2
(45) Date of Patent: Apr. 2, 2019

(54) CAMERA ASSEMBLY WITH SHIELDED IMAGER CIRCUIT

(71) Applicant: Gentex Corporation, Zeeland, MI (US)

(72) Inventors: Danny L. Minikey, Jr., Fenwick, MI (US); Michael G. Hendricks, Wyoming, MI (US)

(73) Assignee: GENTEX CORPORATION, Zeeland, MI (US)

( * ) Notice: Subject to any disclaimer, the term of this patent is extended or adjusted under 35 U.S.C. 154(b) by 16 days.

(21) Appl. No.: 15/458,478

(22) Filed: Mar. 14, 2017

(65) Prior Publication Data

US 2017/0272624 A1 Sep. 21, 2017

Related U.S. Application Data

(60) Provisional application No. 62/309,182, filed on Mar. 16, 2016.

(51) Int. Cl.
| | |
|---|---|
| *H04N 5/225* | (2006.01) |
| *G02B 7/02* | (2006.01) |
| *G02B 7/00* | (2006.01) |
| *B60R 11/04* | (2006.01) |
| *H05K 1/02* | (2006.01) |
| *H05K 1/14* | (2006.01) |

(52) U.S. Cl.
CPC ........... *H04N 5/2252* (2013.01); *B60R 11/04* (2013.01); *G02B 7/003* (2013.01); *G02B 7/02* (2013.01); *H04N 5/2254* (2013.01); *H05K 1/0218* (2013.01); *H05K 1/148* (2013.01); *H05K 2201/0715* (2013.01); *H05K 2201/10121* (2013.01)

(58) Field of Classification Search
None
See application file for complete search history.

(56) References Cited

U.S. PATENT DOCUMENTS

| | | | | |
|---|---|---|---|---|
| 7,965,336 | B2 * | 6/2011 | Bingle | B60R 11/04 348/149 |
| 8,994,878 | B2 * | 3/2015 | Byrne | B60R 1/00 348/148 |
| 9,961,241 | B2 * | 5/2018 | Biemer | H04N 5/2253 |
| 2004/0017501 | A1 * | 1/2004 | Asaga | H04M 1/0264 348/340 |
| 2009/0242361 | A1 | 10/2009 | Haendler et al. | |

(Continued)

OTHER PUBLICATIONS

International Searching Authority, International Search Report and Opinion for Application No. PCT/US2017/022288, filed Mar. 14, 2017, 9 pages.

*Primary Examiner* — James M Hannett

(74) *Attorney, Agent, or Firm* — Price Heneveld LLP; Bradley D. Johnson

(57) ABSTRACT

An imager assembly for a vehicle is disclosed. The assembly comprises an optic lens comprising a proximal end portion, a distal end portion, and a longitudinal axis extending there between. An imager circuit is in conductive connection with an imager connector. The imager connector is configured to communicatively connect the imager circuit to the vehicle. A lens holder of a conductive material forms a shielded cavity configured to receive the proximal end portion of the optic lens and the imager circuit. The lens holder is configured to align the imager with the longitudinal axis of the optic lens.

20 Claims, 4 Drawing Sheets

(56) References Cited

U.S. PATENT DOCUMENTS

| | | |
|---|---|---|
| 2009/0244361 A1 | 10/2009 | Gebauer et al. |
| 2014/0043519 A1 | 2/2014 | Azuma et al. |
| 2016/0191863 A1* | 6/2016 | Minikey, Jr. ......... H04N 5/2254 348/148 |
| 2017/0201661 A1* | 7/2017 | Conger ................ H04N 5/2257 |
| 2017/0272633 A1* | 9/2017 | Minikey, Jr. ......... H04N 5/2254 |
| 2018/0048857 A1* | 2/2018 | Maekawa ............ H04N 5/2251 |

* cited by examiner

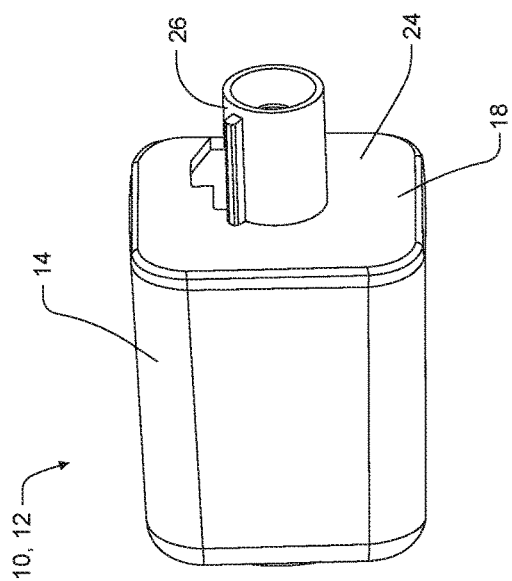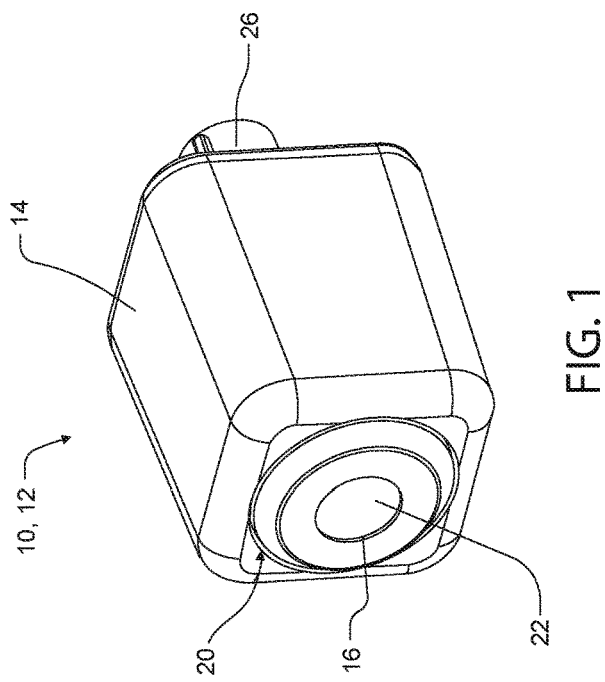

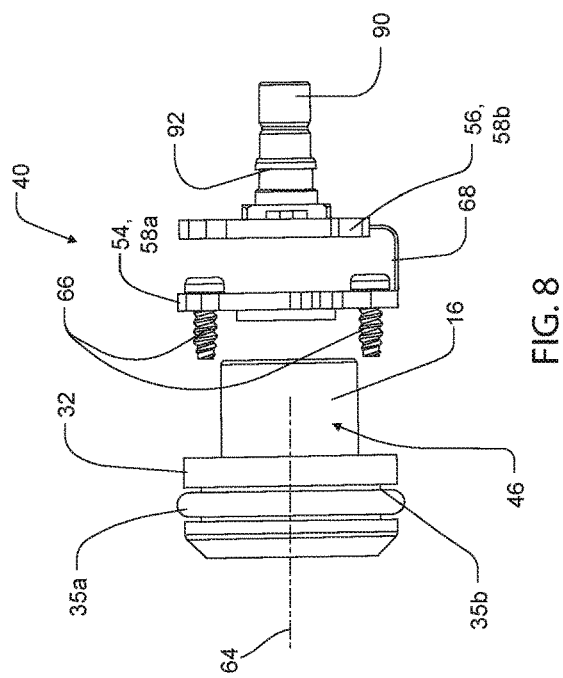
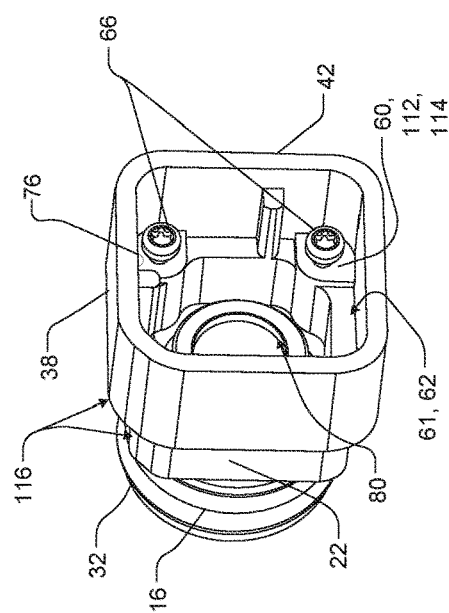

CAMERA ASSEMBLY WITH SHIELDED IMAGER CIRCUIT

CROSS-REFERENCE TO RELATED APPLICATION

This application claims priority to and the benefit under 35 U.S.C. § 119(e) of U.S. Provisional Patent Application No. 62/309,182, filed on Mar. 16, 2016, entitled "CAMERA ASSEMBLY WITH THE ENCLOSED LENS SHIELD," the entire disclosure of which is hereby incorporated herein by reference.

TECHNOLOGICAL FIELD

The present invention generally relates to an imager module and more particularly relates to an imager module configured for use with a vehicle.

BRIEF SUMMARY

In one aspect of the invention, an imager assembly for a vehicle is disclosed. The assembly comprises an optic lens comprising a proximal end portion, a distal end portion, and a longitudinal axis extending there between. The assembly further comprises an imager circuit comprising at least one circuit comprising an imager and a lens holder formed of a conductive material. The lens holder forms a shielded cavity and a mounting surface. The shielded cavity is configured to receive the imager circuit. The mounting surface is configured to receive a mating surface of the imager circuit. The mounting surface is configured to align the longitudinal axis of the optic lens with the imager, and the lens holder is configured to shield the imager circuit electromagnetic interference and prevent emissions from radiating out of the imager circuit.

In another aspect of the invention, an imager assembly for a vehicle is disclosed. The assembly comprises an optic lens comprising a proximal end portion, a distal end portion, and a longitudinal axis extending there between. An imager circuit is in conductive connection with an imager connector. The imager connector is configured to communicatively connect the imager circuit to the vehicle. A lens holder of a conductive material forms a shielded cavity configured to receive the proximal end portion of the optic lens and the imager circuit. The lens holder is configured to align the imager with the longitudinal axis of the optic lens.

In yet another aspect of the invention, an imager assembly for a vehicle is disclosed. The assembly comprises an optic lens comprising a proximal end portion, a distal end portion, and a longitudinal axis extending there between. The assembly further comprises an imager circuit and a lens holder. The imager circuit comprises at least one circuit comprising an imager. The lens holder is formed of a conductive material forming a shielded cavity. The shielded cavity is configured to receive the imager circuit and the lens holder is configured to align the longitudinal axis of the optic lens with the imager.

The assembly further comprises a housing and a lid. The housing is configured to receive the lens holder. The housing comprises a front portion forming a housing cavity having an interior profile shape complementary to an exterior profile of the lens holder. The lid is configured to enclose an assembly opening of the housing cavity. In this configuration, the lid is configured to form a sealed enclosure with the front portion.

These and other features, advantages, and objects of the present invention will be further understood and appreciated by those skilled in the art by reference to the following specification, claims, and appended drawings.

BRIEF DESCRIPTION OF THE DRAWINGS

FIG. 1 is a front perspective view of an imager module of the present disclosure;

FIG. 2 is a rear perspective view of an imager module of the present disclosure;

FIG. 7 is a perspective partial assembly view of the shielded subassembly demonstrating a shielded lens holder of the imager module of the present disclosure; and FIG. 8 is a side partial assembly view of the shielded subassembly demonstrating a lens and circuit of the imager module in accordance with the present disclosure.

DETAILED DESCRIPTION

Figure 3:
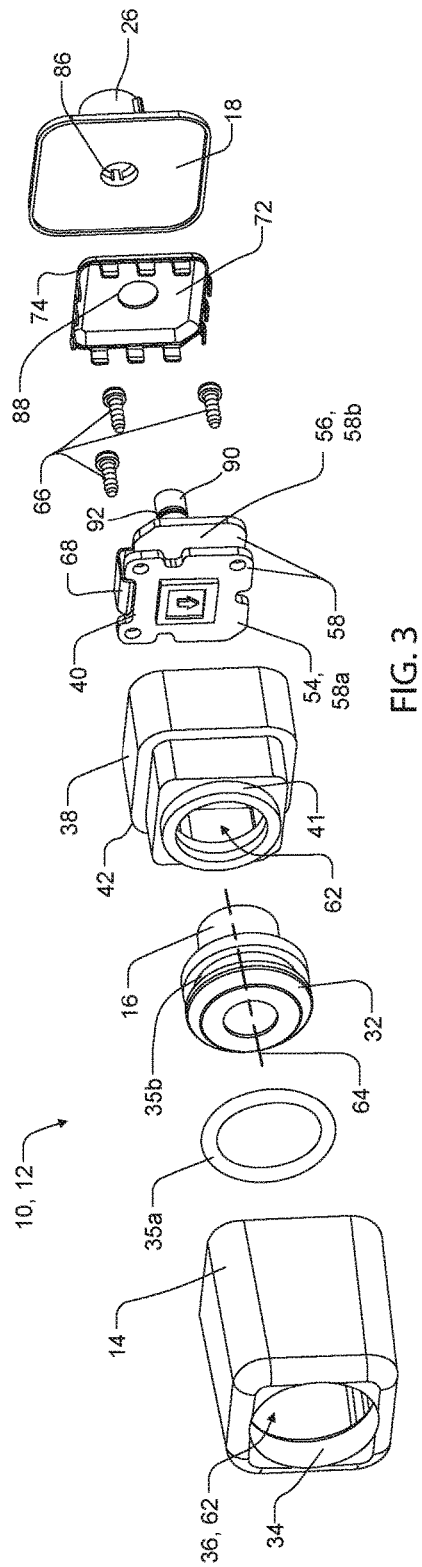
FIG. 3 is an exploded assembly view of an imager module of the present disclosure.

For purposes of description herein, the terms "upper," "lower," "right," "left," "rear," "front," "vertical," "horizontal," and derivatives thereof shall relate to the invention as oriented in FIG. 1. Unless stated otherwise, the term "front" shall refer to the surface of the imager module closer to an intended viewer, and the term "rear" shall refer to the surface of the imager module further from the intended viewer as shown in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a . . . " does not, without more constraints, preclude the existence of additional identical elements in the process, method, article, or apparatus that comprises the element.

Referring to FIGS. 1-2, perspective views of an imager module 10 are shown. The imager module may be configured for use a vehicle. The imager module 10 may correspond to an imager assembly 12 comprising a housing 14 configured to at least partially enclose a lens 16. In some embodiments, the imager assembly may form a sealed assembly with the lens 16 and a lid 18. As described herein, a front surface 20 may correspond to a surface of the housing 14 through which the lens 16 protrudes to form an optic surface 22. A rear surface 24 of the imager assembly 12 may correspond to an outer surface of the lid 18, which may form an imager connector 26. The imager connector may be configured to communicatively connect the imager module 10 to one or more systems of the vehicle.

As discussed herein, the imager assembly 12 may provide for the imager module 10 to be coupled to or otherwise incorporated in one or more panels or features of a vehicle. For example, the imager module 10 may be incorporated in a spoiler, center high mount stop light, deck lid, brake light, a roof mounted assembly, antenna, and other various portions of the vehicle. In some embodiments, the imager connector 26 may provide for the imager module 10 to be incorporated in such panels of the vehicle while providing for the communicative connection of the imager module 10 to one or more systems of the vehicle. The various embodiments of the imager module 10 as described herein may provide for a flexible solution to implement the imager module 10 in various portions of the vehicle.

Figure 4:
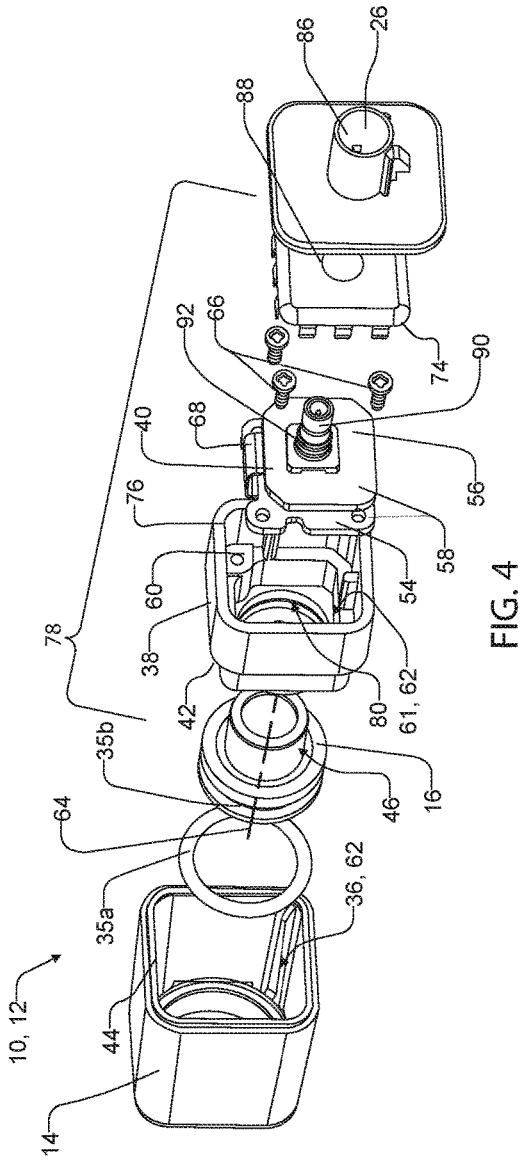
FIG. 4 is an exploded assembly view of an imager module of the present disclosure.

Referring to FIGS. 3-4, exploded views of the imager assembly 12 are shown. In an exemplary embodiment, the lens 16 may form a cylindrical profile 32 configured to engage a cylindrical opening 34 formed in the housing 14. In this configuration, the housing 14 may be configured to receive the lens 16 and form a sealed enclosure for the imager module 10. A seal 35a may be disposed between the housing 14 and the cylindrical opening 34 in an annular groove 35b formed in the profile 32 of the lens 16. Though the annular groove 35b is shown disposed on the lens 16, in some embodiments, the annular groove may be formed in a cylindrical portion 41 of the lens holder 38. In this configuration, the housing 14 may provide for an aesthetic cover configured to form a first cavity 36. The first cavity 36 may enclose one or more elements of the imager assembly 12.

In an exemplary embodiment, a lens holder 38 may be configured to receive the lens 16. The lens holder 38 may be configured to function as a front shield 40. In this configuration, the lens holder 38 may be disposed in the first cavity 36 between the lens 16 and an imager circuit 40. The lens holder 38 may comprise a first exterior profile 42 configured to substantially align with an interior profile 44 of the housing 14. In some embodiments, the first exterior profile 42 may comprise the cylindrical portion 41, which may comprise an annular groove configured to receive the seal 35a. In this configuration, the seal 35a may be disposed between the lens holder 38 and the housing 14. The lens holder 38 may be configured to receive a mating portion 46 of the cylindrical profile 32. In this configuration, the housing 14 may be configured to receive the lens holder 38 with the lens 16 disposed therebetween in a stacked configuration.

In various embodiments, the lens holder 38 may be formed of a conductive material. The conductive material may correspond to an electrically and/or magnetically conductive material. In this configuration, the lens holder may be configured to at least partially enclose and shield the imager circuit 40 from electromagnetic interference (EMI). In this way, the lens holder may provide for an electromagnetic shield to limit interference with the operation of the imager module 10.

The imager circuit 40 may correspond to one or more printed circuit boards (PCBs) 58. The one or more PCBs 58 of the imager circuit 40 may correspond to a plurality of PCBs comprising an imager 54 and one or more control circuits 56. The imager 54 may correspond to any form of light receiving circuitry, and in an exemplary embodiment, may correspond to a charged coupled device (CCD), a complimentary metal-oxide semiconductor (CMOS) image sensor, or other suitable imaging devices in accordance with the disclosure. In the various embodiments, the control circuit 56 and the imager 54 may be configured as a plurality of printed circuit boards, which may be arranged in a stacked parallel configuration, a perpendicular arrangement, or any combination thereof.

The lens holder 38 may be configured to receive the one or more PCBs 58 of the imager circuit 40. In an exemplary embodiment, the lens holder 38 may form a mounting surface 60 formed by a second cavity 61. In some embodiments, the second cavity 61 may correspond to a shielded cavity 62 formed by the lens holder 38. The mounting surface 60 may extend parallel to a longitudinal axis 64 of the lens 16. The one or more PCBs 58 may be mounted to the mounting surface 60 by various attaching features (e.g. one or more fasteners 66). In this configuration, the lens holder 38 may be configured to receive and substantially enclose the one or more PCBs 58 in the shielded cavity 62.

In some embodiments, the one or more PCBs 58 may correspond to a first PCB 58a and a second PCB 58b. The first PCB 58a may be mounted to the lens holder 38 on the mounting surface 60 via the fasteners 66. In this configuration, the lens holder 38 may align the imager 54 with the lens 16. The second PCB 58b may be connected to the first PCB 58a via a conductive connector 68. The conductive connector 68 may correspond to a ribbon cable or various forms of conductive connections. The second PCB 58b may be received by the lens holder 38 and may be retained in an assembled configuration by a rear shield 72 and/or the lid 18 of the housing 14.

As discussed herein, various components of the imager assembly 12 may be enclosed inside the shielded cavity 62 of the housing 14. The rear shield 72 may be configured to enclose the shielded cavity 62. Similar to the lens holder, the rear shield 72 may be of a conductive material configured to prevent EMI from entering the shielded cavity 62. The rear shield 72 may form a second exterior profile 74 configured to substantially align with an interior profile 76 formed by the shielded cavity 62 of the lens holder 38. In this configuration, the lens 16, lens holder 38, and the rear shield 72 may substantially enclose the imager circuit 40 to form a shielded subassembly 78 of the imager module 10.

The first cavity 36 of the housing 14 may be configured to receive the shielded subassembly 78. The lid 18 of the imager assembly 12 may be configured to enclose an assembly opening 80 of the housing 14 and seal the imager module 10. In this configuration, the lid 18 may be attached, fused, and/or welded to the housing 14 to provide for the sealed enclosure. The lid 18 may further be configured to retain the shielded subassembly 78 within the housing 14. In this configuration, the imager module 10 may be substantially protected from EMI as well as dust and fluids to which the device may be exposed during operation.

To provide for communication with the imager module 10 via the imager connector 26, a first aperture 86 may be formed in the lid 18. Additionally, a second aperture 88 may be formed in the rear shield 72. In this configuration, a conductive connector 90 of the imager connector 26 may be communicatively coupled to the imager circuit 40 such that the imager connector 26 may extend outside the imager assembly 12. For example, the conductive connector 90 may pass through the first aperture 86 and the second aperture 88 such that the imager module may communicate with one or more systems of the vehicle. In an assembled configuration, a wire seal 92 may be disposed between the conductive connector 90 and the first aperture 86 to prevent the intrusion of water and/or dust from entering the interior cavity 36 of the housing 14 through the imager connector 26.

Figure 6:
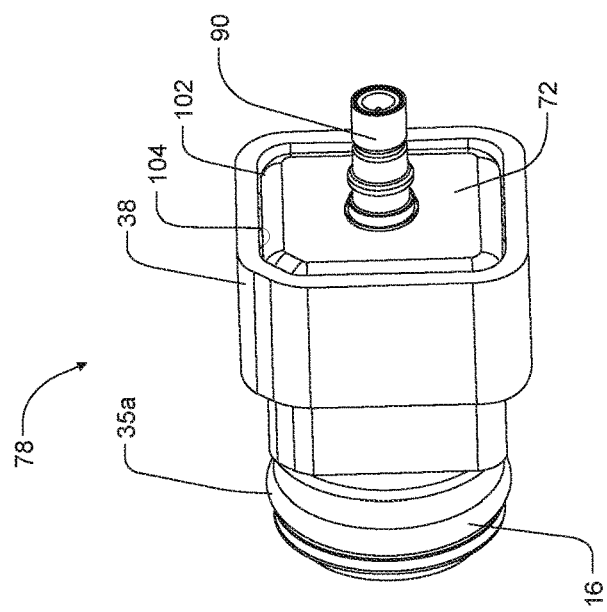
FIG. 6 is a perspective assembly view of a shielded subassembly of the imager module of the present disclosure.
Figure 5:
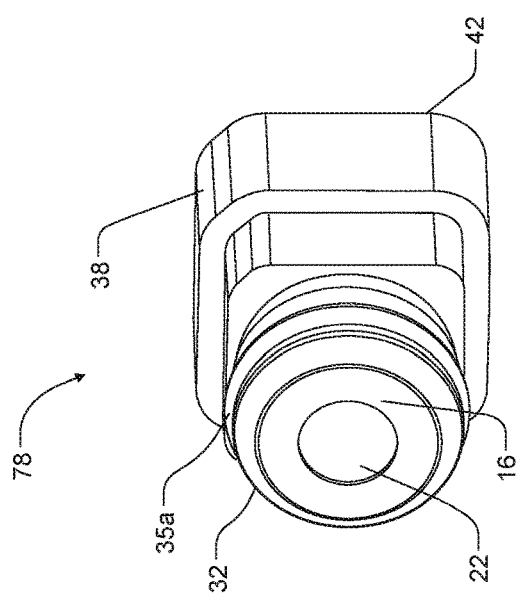
FIG. 5 is a perspective assembly view of a shielded subassembly of the imager module of the present disclosure.

Referring now to FIGS. 5 and 6, perspective assembly views of the shielded subassembly 78 are shown. As discussed herein, each of the lens holder 38 and the rear shield 72 may be of conductive materials configured to shield the imager circuit 40 from EMI and prevent emissions from radiating out of the imager circuit 40. The shielded subassembly 78 may further provide for a manufacturing test assembly that may be manipulated during an assembly operation. For example, the shielded subassembly 78 may correspond to a functional subassembly of the imager module 10 that may be tested prior to a final assembly of the housing 14 and the lid 18. In this configuration, the shielded subassembly 78 may be tested and repaired, if necessary, prior to sealing the imager circuit 40 inside the housing 14 and the lid 18.

As shown in FIG. 6, the rear shield 72 may form a mating profile 102 configured to engage a receiving portion 104 of the lens holder 38. The engagement of the rear shield 72 and the lens holder 38 may be retained by one or more connecting features configured to secure the mating profile 102 to the receiving portion 104. For example, the mating profile 102 and the receiving portion 104 may comprise complementary connecting features in the form of one or more detents, ribs, channels, snaps, etc.

Referring now to FIGS. 7 and 8, partial assembly views of the shielded subassembly 78 are shown. FIG. 7 demonstrates the shielded lens holder 38 and the lens 16 of the imager module 10. FIG. 8 demonstrates the lens 16 aligned with the imager circuit 40 in an assembled orientation including the seal 35a in connection with the lens. In an exemplary embodiment, the lens holder 38 may form a mounting surface 60 formed by a shielded cavity 62 of the lens holder 38. The mounting surface 60 may extend perpendicular to a longitudinal axis 64 of the lens 16. The one or more PCBs 58 may be mounted to the mounting surface 60 by various attaching features (e.g. one or more fasteners 66). In this configuration, the lens holder 38 may be configured to receive and substantially enclose the one or more PCBs 58 in the shielded cavity 62.

The mounting surface 60 may be formed by a recessed surface 112 forming a mounting plane 114. The recessed surface 112 may be formed by the shielded cavity 62 and correspond to a stepped portion 116 of the lens holder 38. The recessed surface 102 may be configured to receive the fasteners 66. In this configuration, the first PCB 58a may be connected to the recessed surface 112 via the fasteners 66 to secure the first PCB 58a to the lens holder 38.

The second PCB 58b may be connected to the first PCB 58a via the conductive connector 68. The conductive connector 68 may correspond to a ribbon cable or various forms of conductive connections. The second PCB 58b may be received by the lens holder 38 and may be retained in an assembled configuration by the rear shield 72 and/or the lid 18 of the housing 14. As described herein, the imager module 10 may for provide for a flexible solution that a may be utilized in various applications.

For purposes of disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the invention as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes, and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of the wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

The invention claimed is:

1. An imager assembly for a vehicle comprising:
   an optic lens comprising a proximal end portion, a distal end portion, and a longitudinal axis extending therebetween;
   an imager circuit comprising at least one circuit comprising an imager; and
   a lens holder formed of a conductive material, wherein the lens holder forms:
      a shielded cavity, wherein the shielded cavity is configured to receive the imager circuit; and
      a mounting surface configured to receive a mating surface of the imager circuit, wherein the mounting surface is configured to align the longitudinal axis of the optic lens with the imager, and wherein the lens holder is configured to shield the imager circuit electromagnetic interference and prevent emissions from radiating out of the imager circuit from the lens holder; and
   a housing configured to receive the lens holder, wherein a portion of the lens is positioned between the lens holder and the housing.

2. The imager assembly according to claim 1, wherein the imager circuit is configured to connect to the mounting surface via at least one fastener.

3. The imager assembly according to claim 1, wherein the at least one circuit comprises a first circuit and a second circuit arranged in a stacked configuration in the shielded cavity.

4. The imager assembly according to claim 3, wherein the first circuit comprises the imager and the second circuit comprises a control circuit in communication with the imager.

5. The imager assembly according to claim 4, wherein the control circuit is in communication with a conductive connector configured to transmit communications to the imager from the vehicle.

6. The imager assembly according to claim 5, further comprising a rear shield configured to connect to an opening formed by the shielded cavity of the lens holder.

7. The imager assembly according to claim 6, wherein the rear shield forms a first aperture configured to receive the conductive connector.

8. The imager assembly according to claim 7, further comprising a housing configured to receive the lens holder.

9. The imager assembly according to claim 8, wherein the housing comprises a front portion forming a housing cavity having an interior profile shape complementary to an exterior profile of the lens holder.

10. The imager assembly according to claim 9, further comprising a lid configured to enclose an assembly opening of the housing cavity, wherein the lid is configured to form a sealed enclosure with the front portion.

11. The imager assembly according to claim 10, wherein the lid forms a second aperture configured to form an interior passage with the first aperture and wherein the conductive connector passes through the interior passage.

12. An imager assembly for a vehicle comprising:
an optic lens comprising a proximal end portion, a distal end portion, and a longitudinal axis extending therebetween;
an imager circuit in conductive connection with an imager connector, wherein the imager connector is configured to communicatively connect the imager circuit to the vehicle;
a lens holder of a conductive material forming a shielded cavity, wherein the shielded cavity is configured to receive the proximal end portion of the optic lens and the imager circuit, wherein the lens holder is configured to align the imager with the longitudinal axis of the optic lens; and
a housing comprising an opening configured to receive a distal end portion of the optic lens, wherein the distal end portion protrudes from the lens holder into the opening of the housing.

13. The imager assembly according to claim 12, wherein the imager circuit comprises a plurality of printed circuit boards (PCBs) arranged in the shielded cavity in a stacked configuration.

14. The imager assembly according to claim 13, wherein the plurality of PCBs comprise a first PCB comprising an imager and a second PCB comprising a control circuit.

15. The imager assembly according to claim 14, wherein the stacked configuration comprises the PCBs stacked parallel to each other and substantially perpendicular to the longitudinal axis of the optic lens.

16. An imager assembly for a vehicle comprising:
an optic lens comprising a proximal end portion, a distal end portion, and a longitudinal axis extending between the proximal end portion and the distal end portion;
an imager circuit comprising at least one circuit comprising an imager;
a lens holder formed of a conductive material forming a shielded cavity, wherein the shielded cavity is configured to receive the imager circuit and the lens holder is configured to align the longitudinal axis of the optic lens with the imager;
a housing configured to receive the lens holder, wherein the housing comprises a front portion forming a housing cavity having an interior profile shape complementary to an exterior profile of the lens holder, wherein at least a portion of the optic lens is disposed between the lens holder and the housing; and
a lid configured to enclose an assembly opening of the housing cavity, wherein the lid is configured to form a sealed enclosure with the front portion.

17. The imager assembly according to claim 16, wherein a distal end portion of the lens holder forms a cylindrical profile shape comprising an annular ring configured to receive a seal, and wherein the housing forms a cylindrical aperture, the distal end portion of the optic lens protruding there-through.

18. The imager assembly according to claim 17, wherein the seal is configured to engage the optic lens and an interior surface of the cylindrical aperture in an assembled configuration.

19. The imager assembly according to claim 1, wherein the portion of the lens comprises a profile shape configured to engage an opening formed through the housing.

20. The imager assembly according to claim 19, wherein an interior surface of the opening sealably engages the profile shape of the lens.

* * * * *